(12) United States Patent
Hall et al.

(10) Patent No.: US 6,507,058 B1
(45) Date of Patent: Jan. 14, 2003

(54) LOW THRESHOLD COMPACT MOS DEVICE WITH CHANNEL REGION FORMED BY OUTDIFFUSION OF TWO REGIONS AND METHOD OF MAKING SAME

(75) Inventors: Jefferson W. Hall, Phoenix, AZ (US); Mohamed Imam, Tempe, AZ (US); Zia Hossain, Tempe, AZ (US); Mohammed Tanvir Quddus, Tempe, AZ (US); Joe Fulton, Chandler, AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 21 days.

(21) Appl. No.: 09/690,876

(22) Filed: Oct. 17, 2000

(51) Int. Cl.[7] ............................................. H01L 29/80
(52) U.S. Cl. ..................... 257/285; 257/288; 257/335; 257/344; 257/387; 257/404; 438/289; 438/291

(58) Field of Search .............................. 257/221, 285, 257/288, 327, 335, 336, 344, 345, 346, 371, 372, 373, 387, 391, 392, 402, 403, 404, 408, 549; 438/197, 200, 217, 276, 286, 289, 291

(56) References Cited

U.S. PATENT DOCUMENTS 5,674,763 A * 10/1997 Sugiura et al. ............. 438/200

* cited by examiner

*Primary Examiner*—Carl Whitehead, Jr.
*Assistant Examiner*—Jack Chen

(57) ABSTRACT

A compact metal oxide semiconductor (MOS) device has its channel region formed by the lateral extension of two high voltage (HV) regions. The two HV regions are implanted into a well region and, as a result of an annealing process, undergo outdiffusion and merge together into a single channel region. The resulting channel region has a dopant concentration that is less than the dopant concentrations of the individual HV regions. The compact MOS device exhibits a low threshold voltage characteristic.

1 Claim, 5 Drawing Sheets

LOW THRESHOLD COMPACT MOS DEVICE WITH CHANNEL REGION FORMED BY OUTDIFFUSION OF TWO REGIONS AND METHOD OF MAKING SAME

FIELD OF THE INVENTION

The present invention relates to semiconductor devices, and more particularly to metal oxide semiconductor (MOS) devices. Even more particularly, the present invention relates to MOS devices having a low threshold and a high breakdown voltage, in which the channel region is formed by the outdiffusion of two regions.

BACKGROUND OF THE INVENTION

Metal oxide semiconductor (MOS) devices are well known in the art. Generally, these devices include a source region, a drain region, a channel region, and a gate. The source and drain regions are spaced from each other by the channel region, and the gate is spaced from the channel region by an oxide layer formed on the substrate surface over the channel region. The source and drain regions are each formed by implanting material of a first conductivity type into the substrate, or a region of the substrate, which is formed of a material of a second conductivity type. For example, to make an n-channel MOS device, source and drain regions formed of n-type material are implanted into a p-type substrate or region. Alternatively, to make a p-channel MOS device, source and drain regions formed of p-type material are implanted into an n-type substrate or region. The channel region, being spatially positioned between the source and drain regions, is the same conductivity type (p-type or n-type) as the substrate or region into which the source and drain regions are implanted.

Electrical conduction between the source and drain regions does not occur appreciably until the voltage applied to the gate region with respect to the source region exceeds a particular value, known as the threshold voltage ($V_{th}$) The value of the threshold voltage for a given MOS device is directly related to the dopant concentration in the channel region. Thus, for a given MOS device, if the dopant concentration in the channel region is reduced, then the threshold voltage will accordingly be reduced, and vice-versa.

Proper MOS performance requires sufficient implantation depths for the source, drain, and channel regions. Of course, sufficient implantation depth may require increased exposure of the substrate to the impurity being implanted which, for a given channel impurity concentration, may result in increased threshold voltage. One way of overcoming increased impurity concentration is to form a region of relatively low impurity concentration, known as a high voltage, or HV region. More specifically, if the dopant impurity is p-type, then the region is termed a PHV region, and if the dopant impurity is n-type, then the region is term an NHV region.

Nonetheless, MOS devices formed using PHV or NHV channel regions still have threshold voltages too high for many low voltage applications. Therefore, there is a need in the art for an MOS device that exhibits a sufficiently low threshold voltage so that the benefits of MOS technology can be employed in low voltage applications. There is also a need for an MOS device of compact design that exhibits this sufficiently low threshold voltage.

DETAIL DESCRIPTION OF THE DRAWINGS

Figure 1:
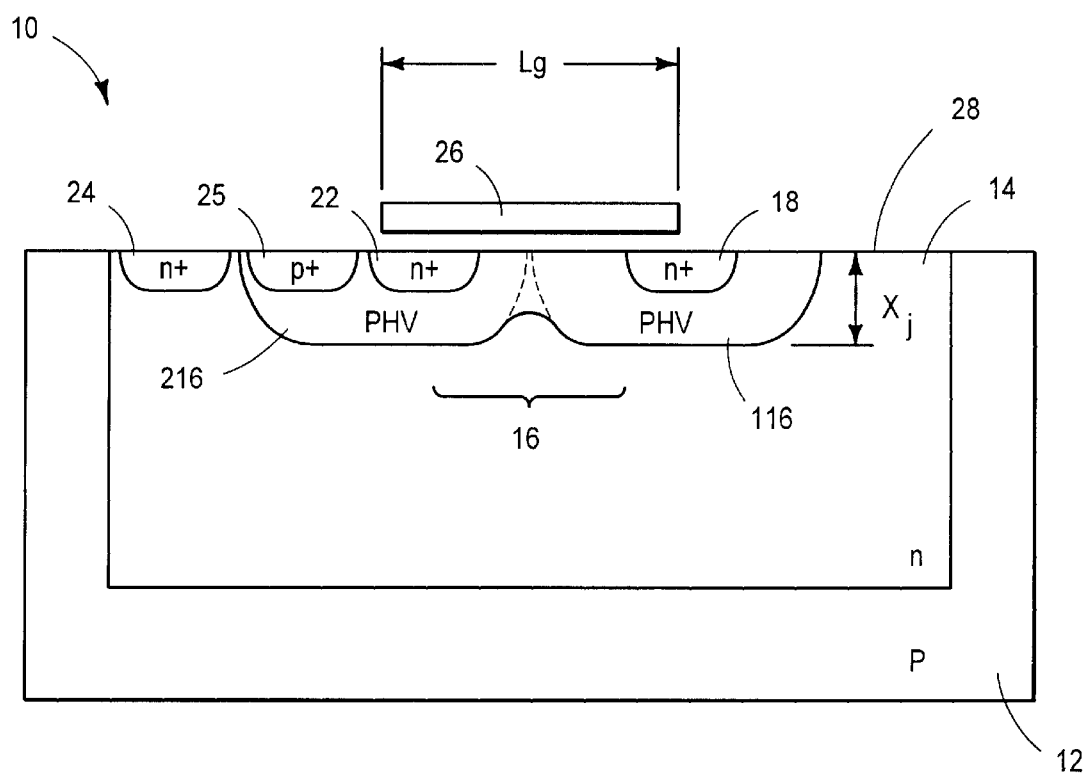
FIG. 1 depicts a cross sectional view of one embodiment of an MOS device according to the present invention.

FIG. 1 illustrates an embodiment of a metal oxide semiconductor (MOS) device 10 according to the present invention. The MOS device 10 illustrated is an n-type MOS device (NMOS) and includes a substrate 12, a well region 14, a channel region 16, drain 18 and source 22 regions, a well contact region 24, a channel contact region 25, and a gate 26.

The NMOS 10 substrate 12 is doped with a material of a p-type conductivity. The well region 14, doped with a material of an n-type conductivity (NWELL), is formed within the substrate 12. The channel region 16, which will be discussed in more detail below, is formed within the NWELL region 14, and is lightly doped with a material of a p-type conductivity. The drain 18 and source 22 regions are each formed in regions 116 and 216 (discussed further below), and are doped with a material of an n-type conductivity. The well contact region 24 is doped with a material of an n-type conductivity, and is formed in the NWELL region 14. The channel contact region 25 is doped with a material of a p-type conductivity, and is formed in region 216 proximate the source region 22. The skilled artisan will appreciate that the channel contact region 25 may physically abut the source region 22, or be separated therefrom. While not depicted, the skilled artisan will also appreciate that the substrate 12 may also include a p-type (e.g., $p^+$) conductivity contact region. Finally, the gate 26 is formed on a surface 28 of the substrate 12, and is positioned over the channel region 16. Though not explicitly illustrated, the ordinarily skilled artisan will appreciate that the gate 26 includes an insulating material (such as an oxide film) that physically separates the gate 26 from the substrate surface 28. With the device illustrated in FIG. 1, the channel region 16 is isolated from the substrate 12 and, by virtue of the NWELL region 14, the ability exists to have different source 22, drain 18, and NWELL region 14 potentials.

The channel region 16 is uniquely formed in the present invention, in that it is formed from two separate regions 116, 216, shown in phantom in FIG. 1. These two regions 116, 216, implanted into the NWELL region 14, are relatively lightly doped with p-type material (e.g., $p^{--}$), and are thus designated as PHV regions. After the two PHV regions 116, 216 are formed in the NWELL region 14, the wafer is subjected to certain annealing processes known in the art, which causes the p-type dopant in each PHV region 116, 216 to diffuse outward (known in the art as "outdiffusion"). This outdiffusion occurs in all directions in the substrate, including laterally. Therefore, the two PHV regions 116, 216 laterally diffuse during the annealing process, and merge to form the single channel region 16.

Importantly, since the channel region 16 is formed from the lateral outdiffusion of the two PHV regions 116, 216, the dopant concentration of the channel region 16 will be lower than that of the individual dopant concentrations of the two PHV regions 116, 216. As a result, the NMOS device 10 will have a low threshold voltage. In fact, the threshold voltage for this NMOS device 10 will be lower than if the entire channel region 16 was only a single PHV region.

Figure 2:
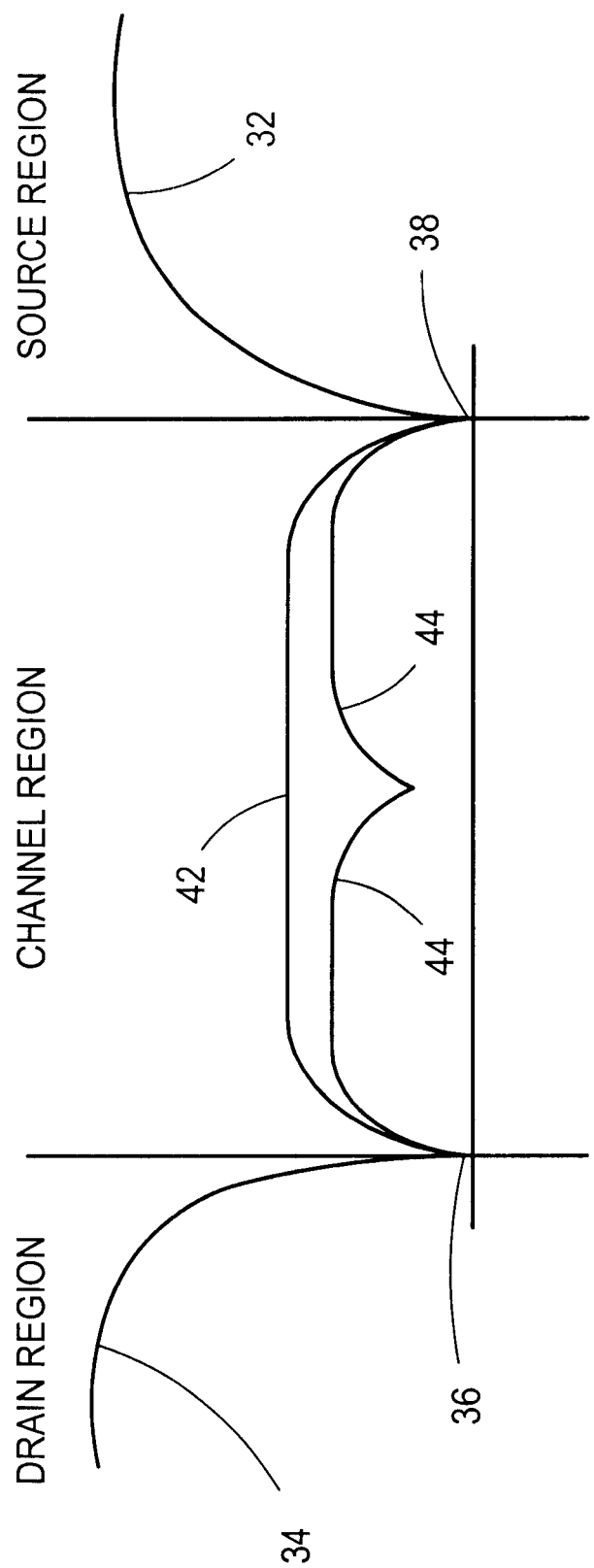
FIG. 2 depicts dopant concentration profiles across the channel region of an MOS device according to the present invention.

For an exemplary illustration of the above-described phenomenon, reference should now be made to FIG. 2. This figure depicts dopant concentration profiles across the channel region 16, including the source 22 and drain 18 region junctions with the channel region, for a single PHV channel region and a channel region formed by the outdiffusion of two PHV channel regions. The source and drain regions have relatively high n-type dopant concentrations 32, 34 (e.g., n⁺), which taper off near the channel junctions 36, 38. Reference numerals 42 and 44 depict the relative p-type dopant concentrations for a given channel formed of a single PHV region and from the outdiffusion of two PHV regions, respectively. As indicated, the dopant concentration, and therefore the threshold voltage, of the channel formed by two PHV regions being outdiffused together, is lower than that of a channel formed from a single PHV region.

Returning once again to the embodiment illustrated in FIG. 1, the two PHV regions 116, 216 are merged together to form the channel region 16. To ensure the two PHV regions 116, 216 do merge together, the maximum length ($L_g$) of the gate 26 should be dimensionally constrained. This is because the amount of lateral extension ($L_{ext}$), or outdiffusion, that each PHV region undergoes during the diffusion process is proportional to the junction depth ($X_j$) that results from the process.

Specifically, the lateral extension that each PHV region undergoes during the diffusion process can be modeled by the following relationship:

$$L_{ext} = (\alpha)(X_j),$$

where $\alpha$ is an outdiffusion factor, which is a physical constant known in the art, and which has a value that ranges between 0.5 and 1.0. Hence, in order for the two PHV regions 116, 216 to merge together, the maximum gate length should meet the following dimensional relationship:

$$L_g \leq 2(\alpha)(X_j).$$

Figure 3:
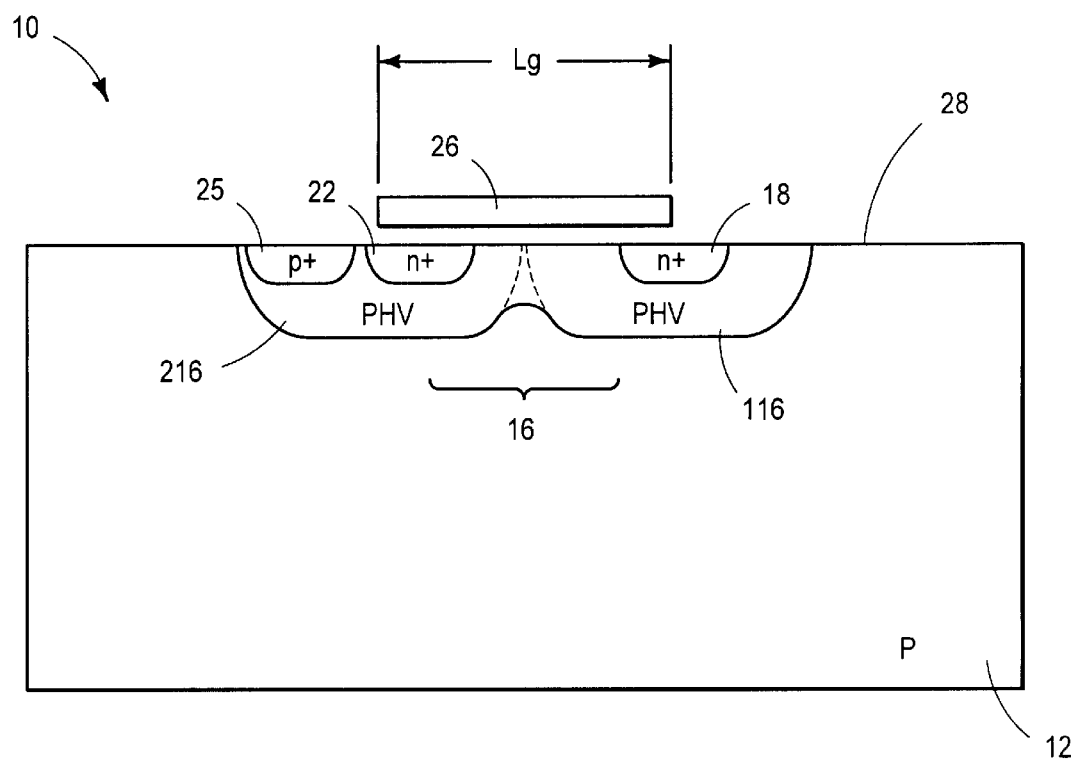
FIG. 3 depicts a cross section view of another embodiment of an MOS device according to the present invention.

The skilled artisan will appreciate that the embodiment depicted in FIG. 1 is only exemplary of one of the various configurations for devices according to the present invention. Indeed, FIG. 3 depicts yet another embodiment which does not include the NWELL region 14 and the concomitant well contact region 24. It is noted that like numerals represent like regions in both FIGS. 1 and 3.

Referring now to FIGS. 4(a)–4(g), the basic methodological steps for making the embodiment illustrated in FIG. 1 will now be discussed. First, the p-type substrate 12 is provided (FIG. 4(a)). Then, the NWELL region 14 is formed by implanting n-type dopant into the substrate 12 (FIG. 4(b)), via an appropriate mask, and subjecting the wafer to an annealing process. After the NWELL region 14 is formed, the oxide film and gate poly, described above, are formed on the substrate surface 28 (FIG. 4(c)). As discussed above, the length of the gate poly should meet the dimensional requirements to ensure merging of the two PHV regions, which are formed next.

Figure 4A:
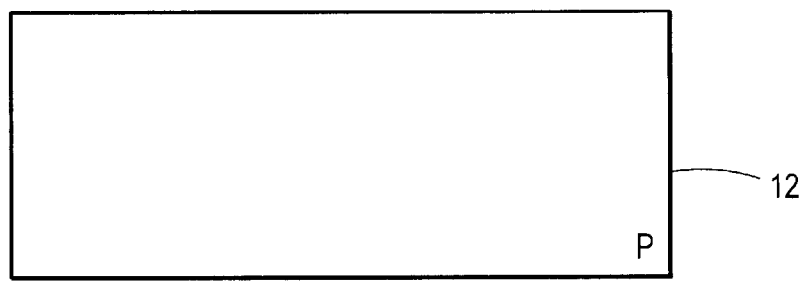
FIGS. 4(a) to 4(g) are cross sectional views depicting various steps in the manufacture of an MOS device according to the present invention.
Figure 4B:
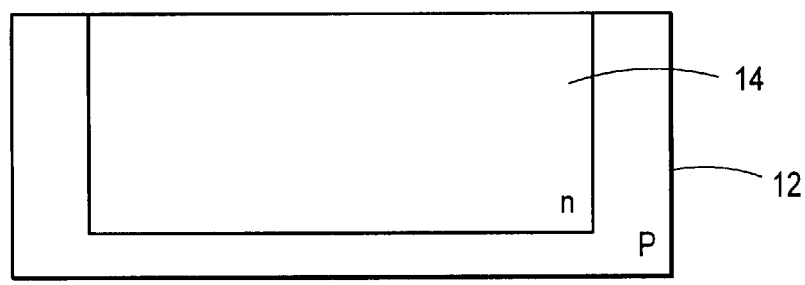
Figure 4C:
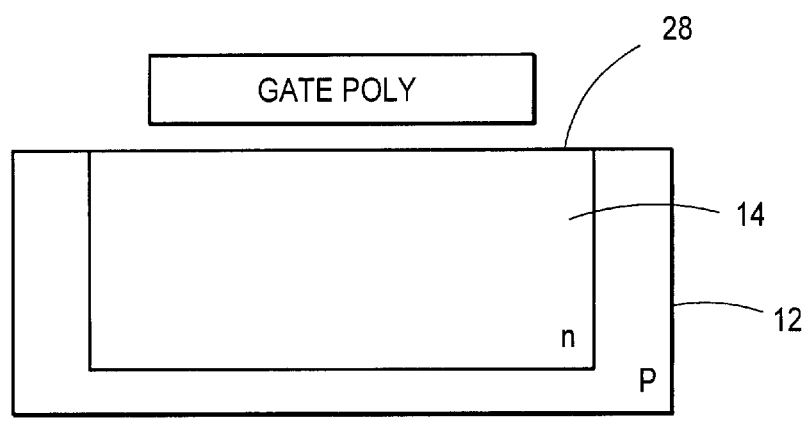
Figure 4D:
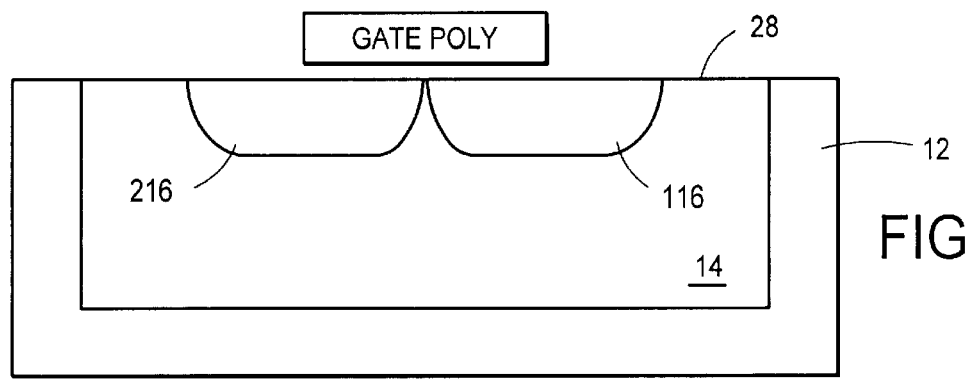
Figure 4E:
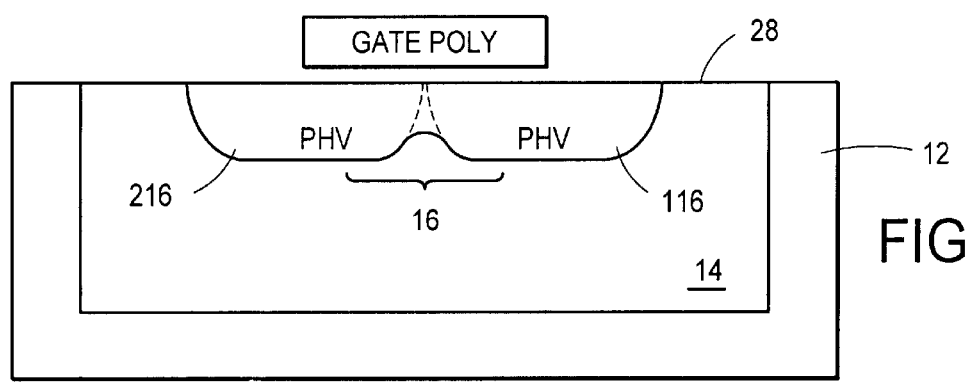
Figure 4F:
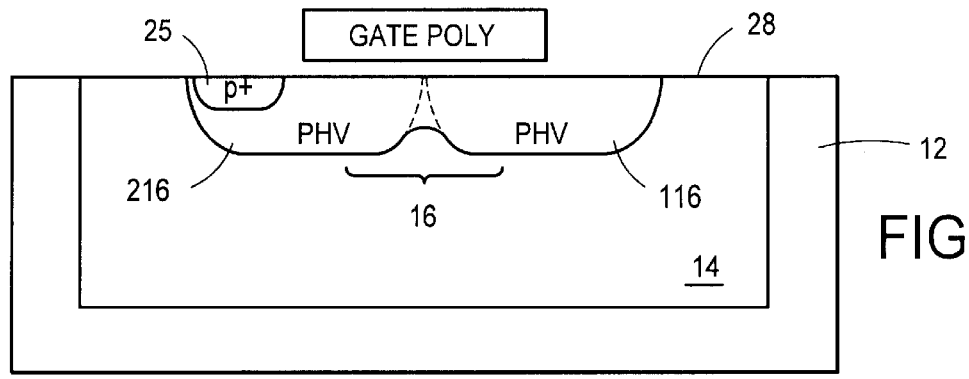
Figure 4G:
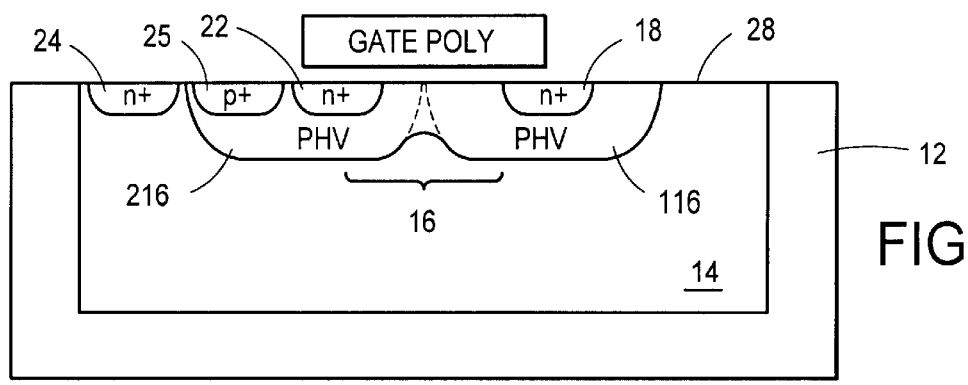

Once the gate poly is formed, two PHV regions 116, 216 are implanted into the NWELL region (FIG. 4(d)). Thereafter, the substrate undergoes an annealing process, causing the PHV regions 116, 216 to outdiffuse, and merge to form the channel region 16 (FIG. 4(e)). After the annealing process, the channel contact region 25 is formed by implanting p-type dopant material, via an appropriate mask, into at least one of the PHV regions (FIG. 4(f)). The skilled artisan will appreciate that, during this implantation process, p-type dopant material may also be implanted into the substrate 12, though not depicted in the Figures. Finally, the source 22 and drain 18 regions are formed by implanting n-type dopant material, via an appropriate mask, into the channel region. The well contact region 24 is also formed, via an appropriate mask, while the source 22 and drain 18 regions are being formed (FIG. 4(g)).

Although this disclosure describes an NMOS device in detail, the ordinarily skilled artisan will appreciate that the present invention is also applicable to PMOS devices. For example, for a PMOS device, the source and drain regions would be p-type regions, and two NHV regions would be implanted and outdiffused to form the channel region. The ordinarily skilled artisan will further appreciate that the present invention extends to MOS devices that do not have isolation between the body and the substrate.

While preferred embodiments of the present invention have been illustrated in detail, it is apparent that modifications and adaptations of the preferred embodiments will occur to those skilled in the art. However, it will be expressly understood that such modifications and adaptations are within the spirit and scope of the present invention as set forth in the following claims.

We claim:

1. A semiconductor device, comprising:

a substrate including at least a first region having a first dopant concentration of a first conductivity type, wherein said first region is formed from the outdiffusion of second and third regions each having a second dopant concentration of the first conductivity type, the second dopant concentration being greater than the first dopant concentration;

source and drain regions positioned within said second and third regions respectively, said source and drain regions each having a third dopant concentration of a second conductivity type, wherein said source and drain regions are separated by a channel region formed as part of said first region and having the first dopant concentration of the first conductivity type; and a gate positioned over said channel region, wherein said gate has a length ($L_g$) meeting the following relationship:

$$L_g \leq 2*\alpha*X_j,$$

where, $\alpha$ is an outdiffusion factor, and
$X_j$ is a junction depth of each of said second and third regions.

* * * * *